US012750102B2

(12) United States Patent
Lindmark et al.

(10) Patent No.: US 12,750,102 B2
(45) Date of Patent: Sep. 29, 2026

(54) RADIOS CONFIGURED TO SPLIT POWER FOR A COMBINED SIGNAL, AND RELATED METHODS OF OPERATING RADIOS

(71) Applicant: Outdoor Wireless Networks LLC, Claremont, NC (US)

(72) Inventors: Björn Lindmark, Sollentuna (SE); Yuan Xu, Sollentuna (SE)

(73) Assignee: Outdoor Wireless Networks LLC, Richardson, TX (US)

( * ) Notice: Subject to any disclaimer, the term of this patent is extended or adjusted under 35 U.S.C. 154(b) by 0 days.

(21) Appl. No.: 18/992,314

(22) PCT Filed: Jun. 9, 2023

(86) PCT No.: PCT/US2023/068183
§ 371 (c)(1),
(2) Date: Jan. 8, 2025

(87) PCT Pub. No.: WO2024/015663
PCT Pub. Date: Jan. 18, 2024

(65) Prior Publication Data
US 2025/0266874 A1 Aug. 21, 2025

Related U.S. Application Data

(60) Provisional application No. 63/388,291, filed on Jul. 12, 2022.

(51) Int. Cl.
*H04B 7/06* (2006.01)
*H01Q 21/24* (2006.01)
*H03F 3/24* (2006.01)

(52) U.S. Cl.
CPC ............... *H04B 7/06* (2013.01); *H01Q 21/24* (2013.01); *H03F 3/245* (2013.01); *H03F 2200/451* (2013.01)

(58) Field of Classification Search
CPC ..... H04B 7/06; H03F 3/245; H03F 2200/451; H01Q 21/24
USPC .......................................................... 375/219
See application file for complete search history.

(56) References Cited

U.S. PATENT DOCUMENTS 10,505,609 B2 12/2019 Zimmerman
2015/0180121 A1* 6/2015 Johansson ............. H01Q 21/28 342/361
2017/0324485 A1* 11/2017 Patel ...................... H04B 17/23
2019/0036586 A1 1/2019 Bradford et al.
2019/0273315 A1 9/2019 Hu et al.
2020/0328787 A1 10/2020 Wang et al.
(Continued)

OTHER PUBLICATIONS

Notification of Transmittal of the International Search Report and the Written Opinion of the International Searching Authority, or the Declaration, in corresponding PCT Application No. PCT/US2023/068183 (Oct. 4, 2023).
(Continued)

*Primary Examiner* — Kevin M Burd
(74) *Attorney, Agent, or Firm* — Myers Bigel, P.A.

(57) ABSTRACT

Methods of operating radios are provided. A method of operating a radio that is coupled to an antenna having a plurality of columns of dual-polarized radiating elements may include splitting radio frequency power within each of a plurality of combinations of first and second data streams. Related radios are also provided.

17 Claims, 15 Drawing Sheets

(56) References Cited

U.S. PATENT DOCUMENTS

| | | | | |
|---|---|---|---|---|
| 2021/0391903 | A1 | 12/2021 | Jam et al. | |
| 2022/0131578 | A1 | 4/2022 | Junttila et al. | |
| 2024/0347911 | A1 * | 10/2024 | Ai | H01Q 5/48 |
| 2024/0372262 | A1 * | 11/2024 | Ma | H01Q 1/52 |

OTHER PUBLICATIONS

Extended European Search Report corresponding to European Application No. 23840397.6 mailed Jun. 2, 2026 (7 pages).

* cited by examiner

RADIOS CONFIGURED TO SPLIT POWER FOR A COMBINED SIGNAL, AND RELATED METHODS OF OPERATING RADIOS

CROSS-REFERENCE TO PRIORITY APPLICATION

This application is a 35 U.S.C. § 371 national stage application of PCT Application No. PCT/US2023/068183, filed Jun. 9, 2023, which claims priority under 35 U.S.C. § 119 to U.S. Provisional Application No. 63/388,291, filed on Jul. 12, 2022, the disclosures of which are hereby incorporated by reference herein in their entirety. The above-referenced PCT Application was published in the English language as International Publication No. WO 2024/015663 A1 on Jan. 18, 2024.

FIELD

The present disclosure relates generally to communications systems and, in particular, to radios for cellular communications systems.

BACKGROUND

Cellular communications systems are well known in the art. In a cellular communications system, a geographic area is divided into a series of regions or "cells" that are served by respective base stations. Each base station may include one or more base station antennas that are configured to provide two-way radio frequency ("RF") communications with subscribers that are within the cell served by the base station. In many cases, each base station is divided into "sectors." In one common configuration, a hexagonally-shaped cell is divided into three 120° sectors in the azimuth plane, and each sector is served by one or more base station antennas that generate radiation patterns of "antenna beams" having azimuth Half Power Beamwidths ("HPBWs") of approximately 65°. Typically, the base station antennas are mounted on a tower or other raised structure, with the antenna beams that are generated by the base station antennas directed outwardly. Base station antennas are often implemented as linear arrays or planar phased arrays of radiating elements.

To increase capacity, base station antennas that include beamforming arrays and/or arrays that are configured to operate with massive multi-input-multi-output ("MIMO") radios have been introduced in recent years. A beamforming array refers to an antenna array that includes multiple columns of radiating elements. RF signals that are to be transmitted by the beamforming array are broken into sub-components that are transmitted through respective groups, or "sub-arrays," of one or more radiating elements. The amplitudes and phases of the sub-components are adjusted by the radio so that the beamforming array generates antenna beams having reduced (narrower) beamwidths in, for example, the horizontal or "azimuth" plane, which increases the directivity or "gain" of the antenna, thereby increasing the supportable throughput. MIMO refers to a communication technique in which a data stream is broken into pieces that are simultaneously transmitted using certain coding techniques over multiple relatively uncorrelated transmission paths between a transmitting station and a receiving station. Multi-column antenna arrays may be used for MIMO transmissions, where each column in the array may be connected to a port of a MIMO radio and used to transmit/receive one of the multiple data streams. In practice, as orthogonal polarizations tend to be highly uncorrelated, the radiating elements in a MIMO array are typically implemented as dual-polarized radiating elements, allowing each column in the MIMO array to be connected to two ports on the radio (where the first port is connected to the first-polarization radiators of the radiating elements in the column, and the second port is connected to the second-polarization radiators of the radiating elements in the column). This technique can effectively halve the number of columns of radiating elements required, as each physical column of the array contains two independent columns of radiators.

A beamforming 8-Transmit/8-Receive ("8T8R") antenna array (which is coupled to eight antenna ports), however, may have small spacing between its four physical columns of radiating elements. As a result, radiation patterns of individual columns of the beamforming 8T8R antenna array may have a larger azimuth HPBW (e.g., 90-100°) and a lower gain than a conventional sector antenna, which may have a 4-Transmit/4-Receive ("4T4R") antenna array (which is coupled to four antenna ports).

SUMMARY

A radio, according to some embodiments, may include a plurality of first-polarization RF ports that are configured to be coupled to respective first-polarization RF ports of an antenna that are coupled to a plurality of columns, respectively, of dual-polarized radiating elements of the antenna. Moreover, the radio may include a plurality of second-polarization RF ports that are configured to be coupled to respective second-polarization RF ports of the antenna that are coupled to the columns, respectively. The first polarization may be different from the second polarization. A first of the first-polarization RF ports of the radio may be configured to provide to a first of the columns: a first RF sub-stream of a first baseband data stream at a first RF power; and a first RF sub-stream of a second baseband data stream at a second RF power.

In some embodiments, the radio may be configured to generate the first RF sub-stream of the first baseband data stream and the first RF sub-stream of the second baseband data stream in first and second frequency bands, respectively, that are different from each other.

According to some embodiments, the first and second RF powers may collectively equal 100% of a total amplification power of a power amplifier coupled to the first of the first-polarization RF ports of the radio. Moreover, the first and second RF powers may be represented by 1−x and x, respectively, and x may be a positive non-zero value that is less than 1.

In some embodiments, a second of the first-polarization RF ports of the radio may be configured to provide to a second of the columns: the first RF sub-stream of the first baseband data stream at the second RF power; and the first RF sub-stream of the second baseband data stream at the first RF power. Moreover, first of the second-polarization RF ports of the radio may be configured to provide to the first of the columns: a second RF sub-stream of the first baseband data stream at the first RF power; and a second RF sub-stream of the second baseband data stream at the second RF power.

According to some embodiments, a second of the second-polarization RF ports of the radio may be configured to provide to the second of the columns: the second RF sub-stream of the first baseband data stream at the second RF power; and the second RF sub-stream of the second baseband data stream at the first RF power. Moreover, the radio may be configured to multiply each RF sub-stream of each of the first and second baseband data streams by a respective complex scalar representing magnitude and phase.

In some embodiments, the first and second of the columns may be consecutive columns. The first and second of the first-polarization RF ports of the antenna may be coupled to the first and second of the columns, respectively. The first and second of the second-polarization RF ports of the antenna may be coupled to the first and second of the columns, respectively. Moreover, the radio may be a first of a plurality of radios that are configured to be coupled to the antenna, and a second of the radios may be configured to provide to a third and a fourth of the columns: a third RF sub-stream of the first baseband data stream together with a third RF sub-stream of the second baseband data stream; and a fourth RF sub-stream of the first baseband data stream together with a fourth RF sub-stream of the second baseband data stream.

A method of operating a radio that is coupled to an antenna having a plurality of columns of dual-polarized radiating elements may be provided according to some embodiments. The method may include providing to a first of the columns via a first of a plurality of first-polarization ports of the radio: a first RF sub-stream of a first baseband data stream at a first RF power; and a first RF sub-stream of a second baseband data stream at a second RF power.

In some embodiments, the method may include generating the first RF sub-stream of the first baseband data stream and the first RF sub-stream of the second baseband data stream in first and second frequency bands, respectively, that are different from each other.

According to some embodiments, the first and second RF powers may collectively equal 100% of a total amplification power of a power amplifier coupled to the first of the first-polarization RF ports of the radio. Moreover, the first and second RF powers may be represented by 1−x and x, respectively, and x may be a positive non-zero value that is less than 1.

In some embodiments, the method may include providing to a second of the columns via a second of the first-polarization ports: the first RF sub-stream of the first baseband data stream at the second RF power; and the first RF sub-stream of the second baseband data stream at the first RF power. Moreover, the radio may multiply each RF sub-stream of each of the first and second baseband data streams by a respective complex scalar representing magnitude and phase.

According to some embodiments, the method may include providing to the first of the columns via a first of a plurality of second-polarization ports of the radio: a second RF sub-stream of the first baseband data stream at the first RF power; and a second RF sub-stream of the second baseband data stream at the second RF power. The second polarization may be different from the first polarization.

In some embodiments, the method may include providing to the second of the columns via a second of the second-polarization ports: the second RF sub-stream of the first baseband data stream at the second RF power; and the second RF sub-stream of the second baseband data stream at the first RF power. Moreover, the first and second of the columns may be consecutive columns.

According to some embodiments, the radio may be a first radio, and the method may include splitting, by a second radio, RF power by providing: a third RF sub-stream of the first baseband data stream together with a third RF sub-stream of the second baseband data stream; and a fourth RF sub-stream of the first baseband data stream together with a fourth RF sub-stream of the second baseband data stream. Moreover, the method may include replacing the first and second radios with a single radio that is coupled to the first through fourth of the columns.

In some embodiments, the radio may be a 4T4R radio.

A radio, according to some embodiments, may be configured to distribute a total amplification power for each of a plurality of RF ports of the radio among a plurality of RF sub-streams. For example, each of the RF ports may be configured to output together a first RF power and a second RF power that collectively equal 100% of the total amplification power.

In some embodiments, the radio may include first through fourth of the RF ports, the first and third of the RF ports may be configured to be coupled to consecutive first and second columns, respectively, of radiating elements of an antenna, and the RF sub-streams may include a plurality of RF sub-streams of a first baseband data stream and a plurality of RF sub-streams of a second baseband data stream. Moreover, distributing the total amplification power may include outputting: a first of the RF sub-streams of the first baseband data stream at the first RF power and a first of the RF sub-streams of the second baseband data stream at the second RF power, to the first column via the first of the RF ports; and the first of the RF sub-streams of the first baseband data stream at the second RF power and the first of the RF sub-streams of the second baseband data stream at the first RF power, to the second column via the third of the RF ports.

According to some embodiments, the radiating elements may be respective dual-polarized radiating elements, the first and third of the RF ports may have a first polarization, and the second and fourth of the RF ports may have a second polarization that is different from the first polarization. Moreover, the second and fourth of the RF ports may be configured to be coupled to the consecutive first and second columns, respectively.

In some embodiments, the radio may be configured to generate the first of the RF sub-streams of the first baseband data stream and the first of the RF sub-streams of the second baseband data stream in first and second frequency bands, respectively, that are different from each other.

DETAILED DESCRIPTION

Figure 1A:
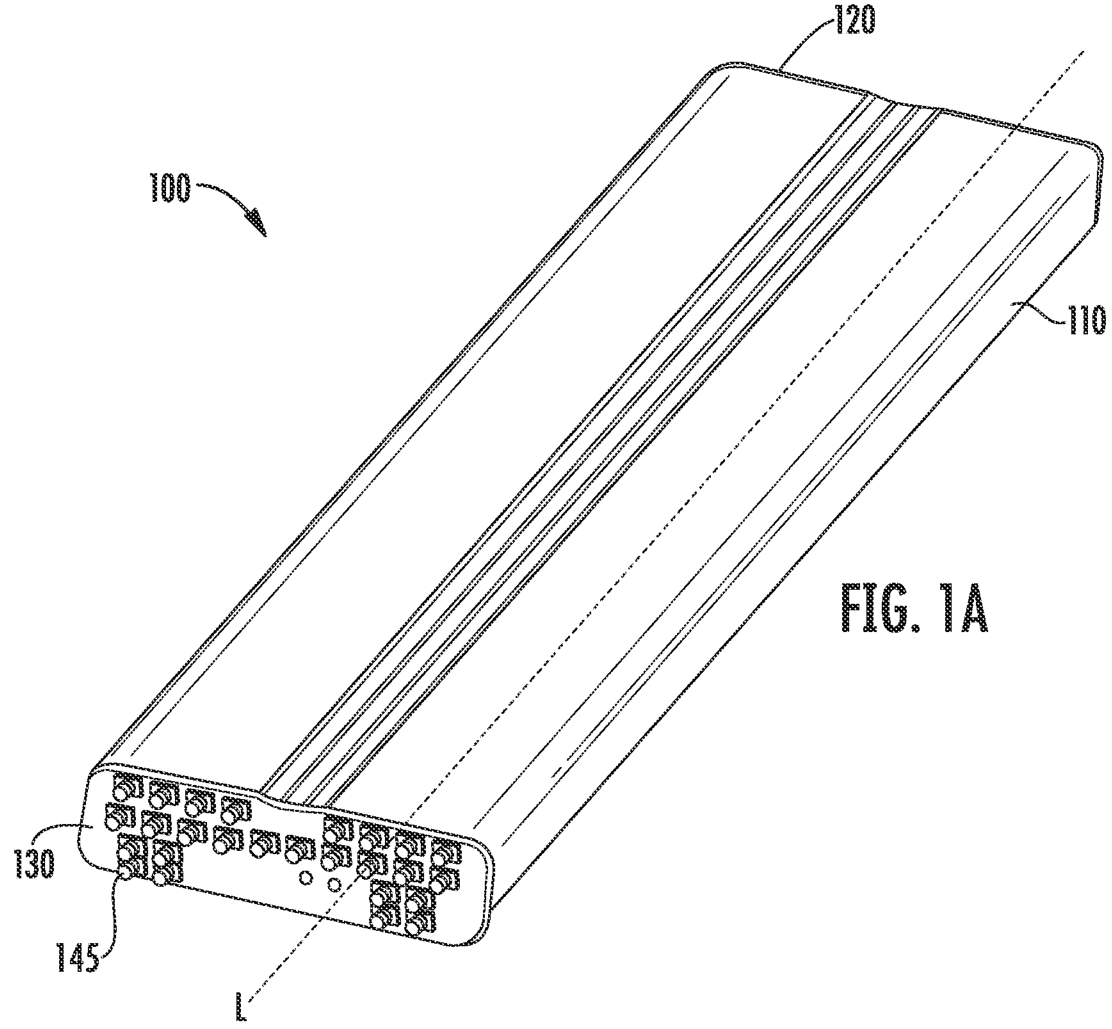
FIG. 1A is a front perspective view of a base station antenna, according to embodiments of the present invention.

The use of MIMO transmission techniques can significantly increase the throughput supported by a base station antenna. Moreover, the greater the number of independent data streams, the greater the increase in throughput. Four-column arrays of dual polarized radiating element can support "8T8R" MIMO communication (where "8T" indicates eight separate sub-streams for transmissions from the base station antenna and "8R" means that the base station antenna can receive eight separate sub-streams).

Unfortunately, there are some cases where there are limitations on the effective isotropic radiated power ("EIRP") of the antenna beams generated by a base station antenna. Given the enhanced gain provided by the beamforming array and the eight ports on the radio (each of which has a separate power amplifier), the EIRP of an 8T8R array coupled to an 8T8R radio may be very large, and may exceed the EIRP constraints, thus precluding the use of the 8T8R radio in this situation.

While 8T8R radios are not currently configured to allow an operator to limit the maximum EIRP, it is quite possible that future 8T8R radios will include a software or hardware "fix" that allows an operator to specify a maximum EIRP. It is also possible that the EIRP constraints may be relaxed in the future.

If an operator believes that the EIRP constraints may be lifted in the future, or may be solved by a software fix to the 8T8R radio, it may make sense to use the 8T8R radio and the four-column array of radiating elements to support two 4T4R systems. This could be accomplished, for example, by using the left two columns of the array for the first 4T4R system and the right two columns of the array for the second 4T4R system. Two 4T4R radios could be used to support such a "dual 4T4R" approach, or a single 8T8R radio may be used that can be configured to operate either as an 8T8R radio or as two 4T4R radios (such radios are commercially available). However, when the dual 4T4R approach is used, the individual antenna beams generated by each column tend to have rather large azimuth HPBWs such as azimuth HPBWs of about 90°-100°. These wider antenna beams result in lower gain than would be achieved with conventional columns of radiating elements that are designed to have azimuth HPBWs of about 65°. The lower gain results in reduced system performance. The wider antenna beams will also extend outside of a 120° sector, creating interference with additional sectors.

There are also situations where an operator is not willing to deploy an 8T8R radio due to the current cost of such radios, and may instead deploy two 4T4R systems. The base station antennas used with such systems would include four linear arrays of radiating elements that are configured as sector arrays that each generate antenna beams having azimuth HPBWs of about 65°. If the operator later wants to upgrade to an 8T8R system, it will be necessary to not only replace the two 4T4R radios, but also to replace the base station antenna, since the 8T8R radio is designed to work with a four-column beamforming array that has four more closely spaced columns of (smaller) radiating elements, where each column generates individual antenna beams having an azimuth HPBW of about 90°-100°. It would be advantageous if 8T8R antenna arrays were available that could be used with 4T4R radios and provide suitable gain, as this would allow an operator to deploy base station antennas that had 8T8R antenna arrays. These antennas could initially be used with two 4T4R radios, and later could be used with an 8T8R radio. In other words, such radios would provide operators with greater flexibility and allow them to use the same base station antenna with different radio combinations.

Pursuant to embodiments of the present invention, radios are provided that can, in conjunction with a multi-column array of radiating elements, generate antenna beams having narrowed azimuth HPBW and/or increased gain. Moreover, 100% of the power generated by the radio may be used (thus achieving zero power loss) by distributing the total power (e.g., total power level) among two RF sub-streams that are output at a radio port. Thus, even though radiation patterns of an 8T8R antenna array typically have a larger HPBW (e.g., 90° or more) than radiation patterns of a conventional 4T4R antenna array (e.g., an HPBW of about 65°), radios according to embodiments of the present invention can narrow the HPBW of radiation patterns of an 8T8R antenna array to about 65° or smaller by outputting combinations of sub-streams at radio ports. As an example, the radios can achieve narrower HPBW by selectively applying respective power levels (e.g., by applying different digital amplitude weights) to the sub-streams of a combination. The radios can also increase gain (e.g., by more than 1 decibel ("dB")) by outputting the combinations of sub-streams.

Example embodiments of the present invention will be described in greater detail with reference to the attached figures.

FIG. 1A is a front perspective view of a base station antenna 100, according to embodiments of the present invention. The antenna 100 may be, for example, a cellular base station antenna at a macrocell base station or at a small cell base station. As shown in FIG. 1A, the antenna 100 is an elongated structure and has a generally rectangular shape. The antenna 100 includes a radome 110. In some embodiments, the antenna 100 further includes a top end cap 120 and/or a bottom end cap 130. The bottom end cap 130 may include a plurality of RF connectors 145 mounted therein. The connectors 145, which may also be referred to herein as RF "ports," are not limited, however, to being located on the bottom end cap 130. Rather, one or more of the connectors 145 may be provided on, for example, the rear (i.e., back) side of the radome 110 that is opposite the front side of the radome 110. The antenna 100 is typically mounted in a vertical configuration (i.e., the long side of the antenna 100 extends along a vertical axis L with respect to Earth).

Figure 1B:
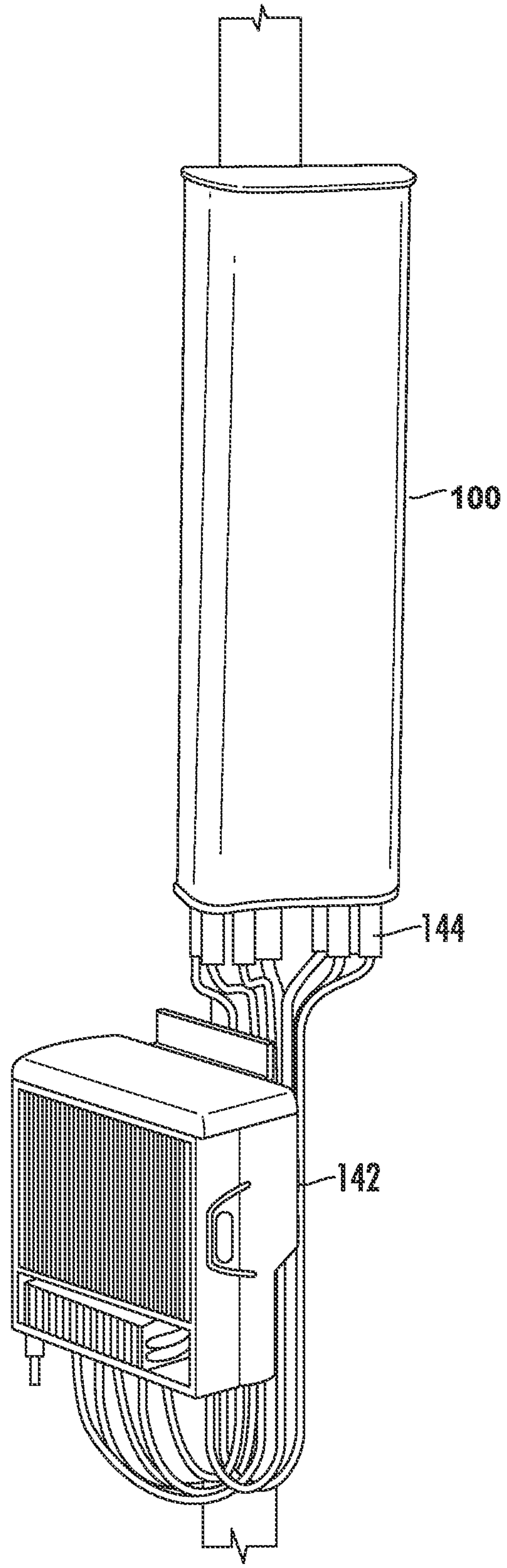
FIG. 1B is a front perspective view of the base station antenna of FIG. 1A electrically connected to a radio.

FIG. 1B is a front perspective view of the base station antenna 100 electrically connected to a radio 142 by RF transmission lines 144, such as coaxial cables. For example, the radio 142 may be a cellular base station radio, and the antenna 100 and the radio 142 may be located at (e.g., may be components of) a cellular base station. In some cases, the radio 142 may be mounted on the back surface of the antenna 100 rather than below the antenna 100. According to some embodiments, a single radio 142 may be coupled to the antenna 100. In other embodiments, multiple radios 142 may be coupled to the antenna 100. Moreover, each radio 142 may be a beamforming radio.

Figure 1C:
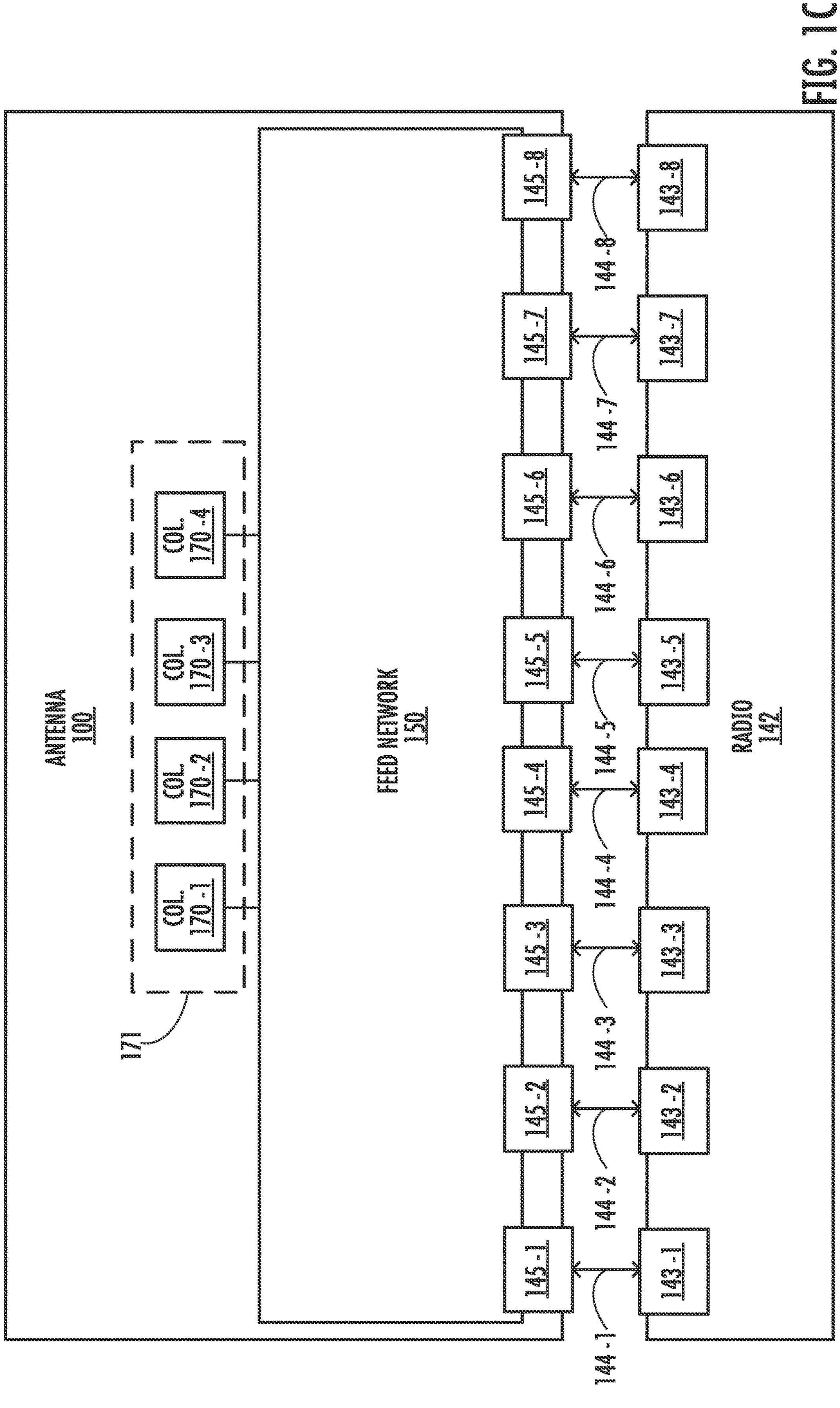
FIG. 1C is a schematic block diagram of ports of the base station antenna of FIG. 1A electrically connected to ports of the radio of FIG. 1B.

FIG. 1C is a schematic block diagram of ports 145 of the base station antenna 100 electrically connected to respective ports 143 of the radio 142. As shown in FIG. 1C, ports 145-1 through 145-8 of the antenna 100 are electrically connected to ports 143-1 through 143-8, respectively, of the radio 142 by respective RF transmission lines 144-1 through 144-8, such as coaxial cables.

The antenna 100 may include arrays (e.g., vertical columns) 170-1 through 170-4 of radiating elements 271 (FIG. 2) that are configured to transmit and/or receive RF signals. The four columns 170-1 through 170-4 may together constitute a beamforming array 171 that is suitable for use with an 8T8R radio. The antenna 100 may also include a feed network 150 that is coupled between the columns 170 and the radio 142. For example, the columns 170 may be coupled to respective RF transmission paths (e.g., including one or more RF transmission lines) of the feed network 150.

In some embodiments, the feed network 150 may include feed circuitry that is coupled between the ports 145 and the columns 170. The feed circuitry can couple downlink RF signals from the radio 142 to radiating elements 271 that are in columns 170. The feed circuitry may also couple uplink RF signals from radiating elements 271 that are in columns 170 to the radio 142. For example, the feed circuitry may include power dividers, RF switches, RF couplers, and/or RF transmission lines.

Moreover, the antenna 100 may include phase shifters that are used to electronically adjust the tilt angle of the antenna beams generated by each column 170. The phase shifters may be located at any appropriate location along the RF transmission paths that extend between the ports 145 and the columns 170. Accordingly, though omitted from view in FIG. 1C for simplicity of illustration, the feed network 150 may include phase shifters.

For simplicity of illustration, FIG. 1C (and FIG. 1D, discussed below) only illustrates the four columns 170-1 through 170-4 of radiating elements 271 that form the 8T8R beamforming array 171. It will be appreciated that the base station antenna 100 may include additional arrays of radiating elements and additional RF ports that are not shown in FIG. 1C.

Figure 1D:
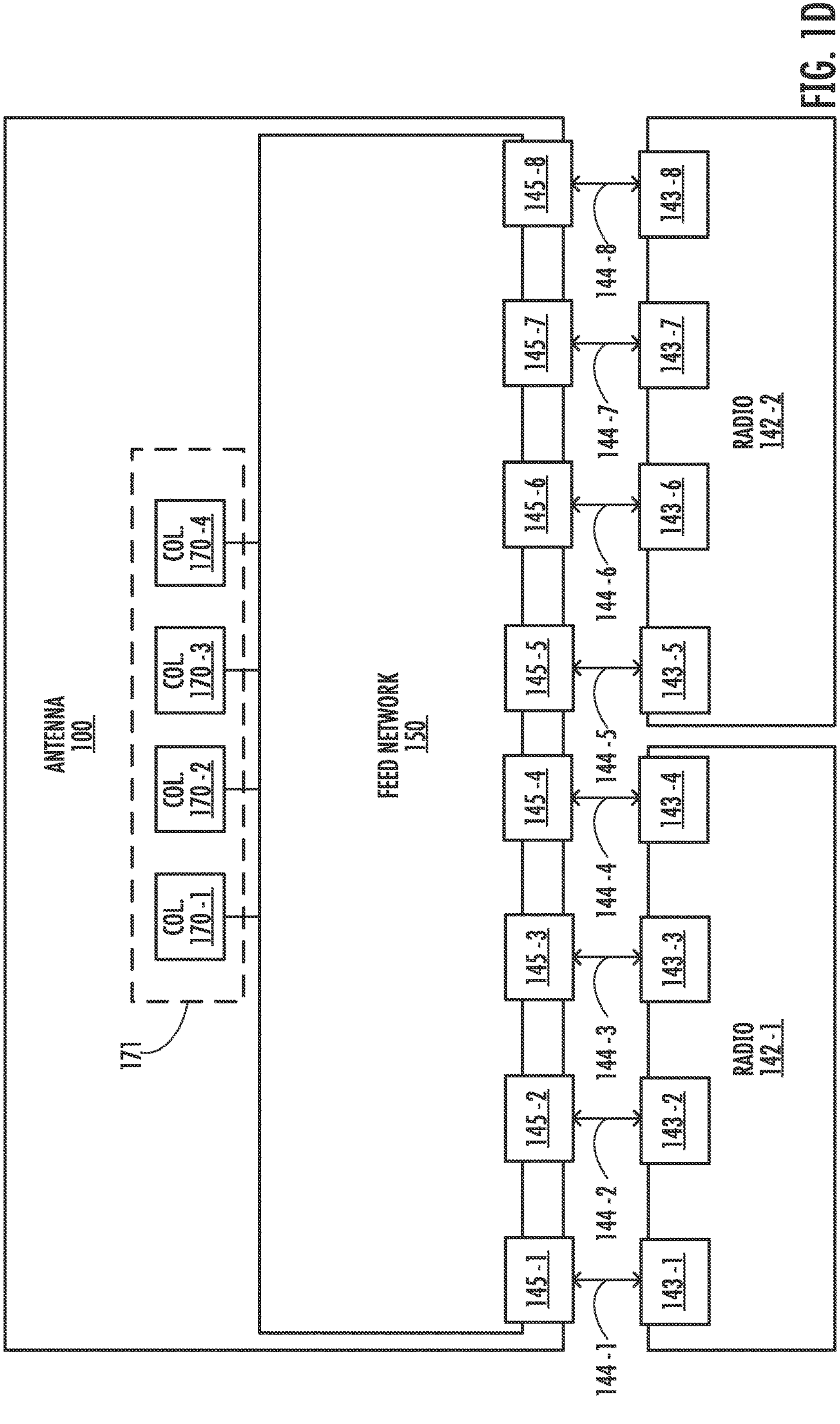
FIG. 1D is a schematic block diagram of ports of the base station antenna of FIG. 1A electrically connected to ports of two radios.

FIG. 1D is a schematic block diagram of ports 145 of the base station antenna 100 of FIG. 1A electrically connected to ports 143 of first and second radios 142-1, 142-2. Each radio 142 may be a 4T4R radio. As shown in FIG. 1D, the first radio 142-1 may have four ports 143-1 through 143-4 that are coupled to four ports 145-1 through 145-4, respectively, of the antenna 100. Moreover, the second radio 142-2 may have four ports 143-5 through 143-8 that are coupled to four ports 145-5 through 145-8, respectively, of the antenna 100.

Figure 1E:
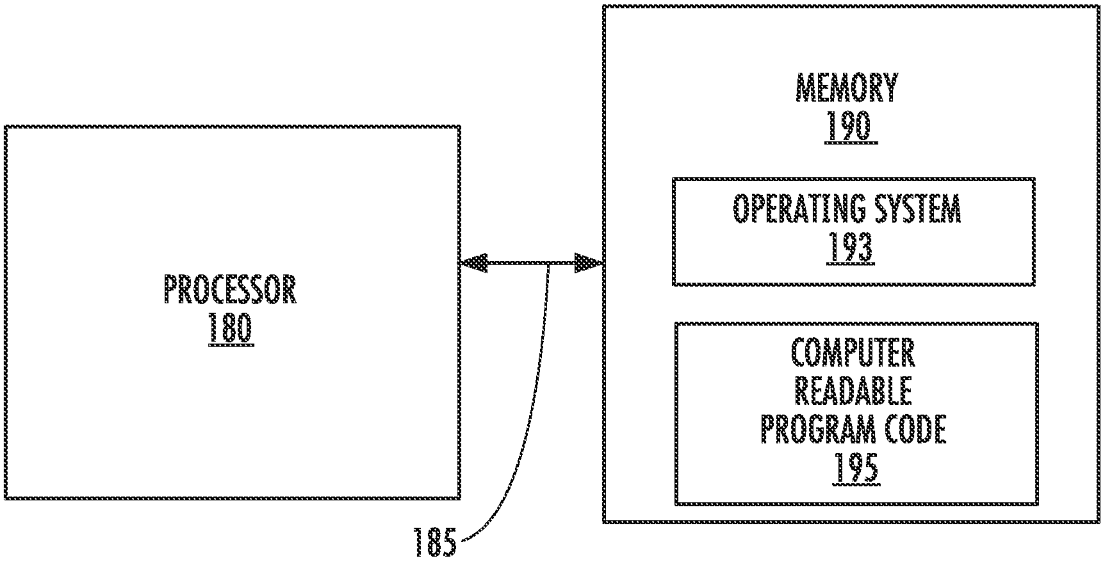
FIG. 1E is a block diagram that illustrates details of an example processor and memory that may be used in accordance with various embodiments.

FIG. 1E is a block diagram that illustrates details of an example processor 180 and memory 190 that may be used in accordance with various embodiments. The processor 180 communicates with the memory 190 via an address/data bus 185. The processor 180 may be, for example, a commercially available or custom microprocessor. Moreover, the processor 180 may include multiple processors. The memory 190 may be a non-transitory computer readable storage medium and may be representative of the overall hierarchy of memory devices containing the software and data used to implement various functions of a radio 142 (FIG. 1B) as described herein. For example, the radio 142 may comprise the processor 180 and the memory 190. The memory 190 may include, but is not limited to, the following types of devices: cache, ROM, PROM, EPROM, EEPROM, flash, static RAM ("SRAM"), and dynamic RAM ("DRAM").

As shown in FIG. 1E, the memory 190 may hold various categories of software and data, such as computer readable program code 195 and/or an operating system 193. The operating system 193 controls operations of the radio 142. In some embodiments, the operating system 193 may manage the resources of the radio 142 and may coordinate execution of various programs by the processor 180. For example, the computer readable program code 195, when executed by a processor 180 of the radio 142, may cause the processor 180 to perform any of the operations illustrated in the flowcharts of FIGS. 4A-4F (as well as operations illustrated in Blocks 410 through 420-2', or Blocks 420-3 and 420-4, of FIG. 4G). Accordingly, the processor 180 may be coupled to, and configured to control, various RF hardware/circuitry of the radio 142, such as one or more RF signal sources (e.g., one or more RF oscillators), one or more RF amplifiers, and/or one or more RF mixers/combiners. For simplicity of illustration, however, such hardware/circuitry is omitted from view in FIG. 1E.

Figure 2:
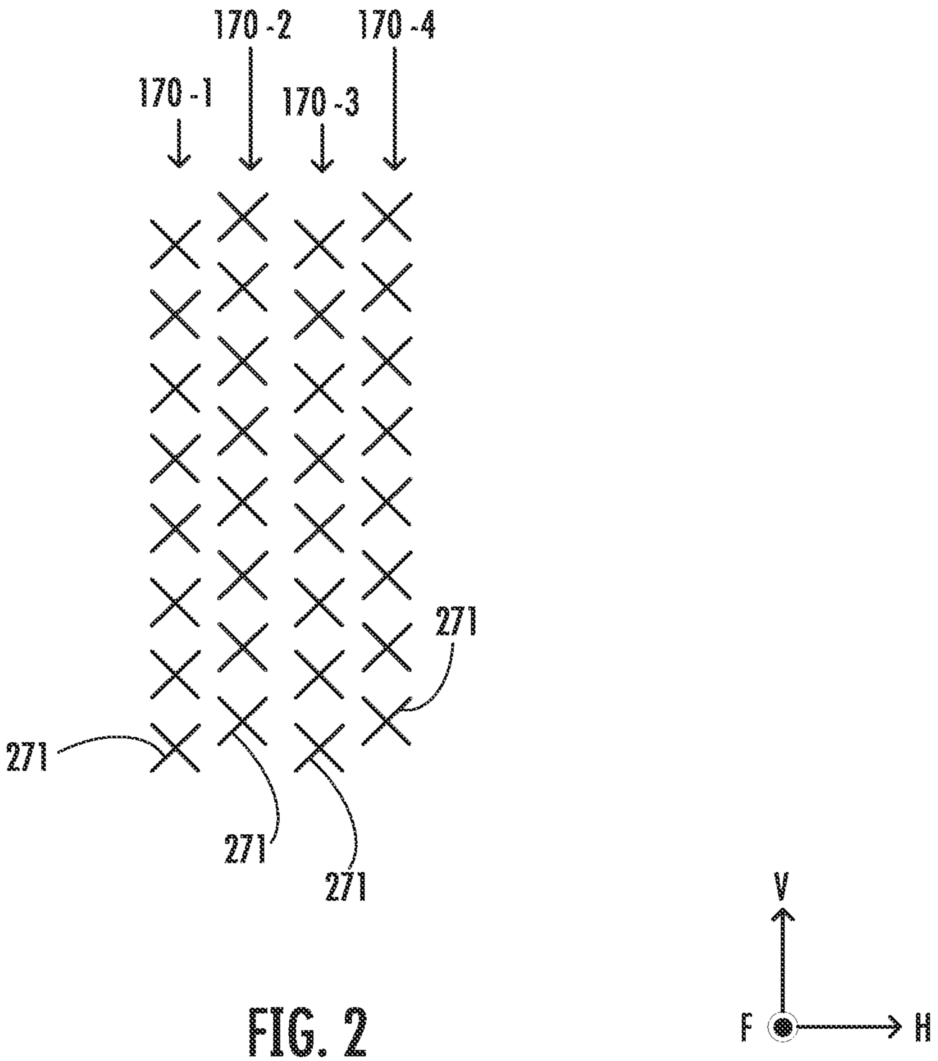
FIG. 2 is an example schematic front view of the four-column beamforming array included in the antenna of FIG. 1A.

FIG. 2 is an example schematic front view of the 8T8R beamforming array 171 (FIGS. 1C and 1D) of the base station antenna 100 of FIG. 1A. The beamforming array 171 includes four vertical columns 170-1 through 170-4 of radiating elements 271. The four physical vertical columns are spaced apart from each other in a horizontal direction H. Each vertical column 170 of radiating elements 271 may extend in a vertical direction V from a lower portion of the antenna 100 to an upper portion of the antenna 100. The vertical direction V may be, or may be parallel with, the longitudinal axis L (FIG. 1A). The vertical direction V may also be perpendicular to the horizontal direction H and a forward direction F. As used herein, the term "vertical" does not necessarily require that something is exactly vertical (e.g., the antenna 100 may have a small mechanical downtilt).

The columns 170 are each configured to transmit and/or receive RF signals in one or more frequency bands, such as one or more bands comprising frequencies between 2,350 megahertz ("MHz") and 2,390 MHz. Though FIG. 2 illustrates four columns 170-1 through 170-4, the antenna 100 may include more columns 170. For example, in other embodiments, the techniques disclosed herein could be used with an eight-column array so that this array could be used with two 8T8R radios or one 16T16R radio. Moreover, the number of radiating elements 271 in a column 170 can be any quantity from two to twenty or more. For example, the four columns 170-1 through 170-4 shown in FIG. 2 may each have five to twenty radiating elements 271. In some embodiments, the columns 170 may each have the same number (e.g., eight) of radiating elements 271.

Figure 3A:
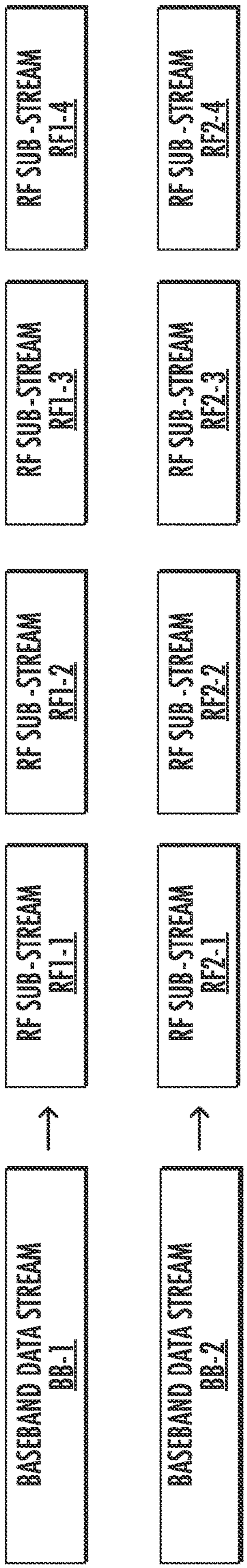
FIG. 3A is a schematic diagram of sub-streams of a plurality of data streams.

FIG. 3A is a schematic diagram of sub-streams of two data streams. As shown in FIG. 3A, first through fourth RF sub-streams RF1-1 through RF1-4 may be generated from a first baseband data stream BB-1. Similarly, first through fourth RF sub-streams RF2-1 through RF2-4 may be generated from a second baseband data stream BB-2. For example, a radio 142 (FIG. 1B) may divide each of the first and second baseband data streams BB-1, BB-2 into first through fourth baseband sub-streams, and then may convert the first through fourth baseband sub-streams of the first baseband data stream BB-1 into the first through fourth RF sub-streams RF1-1 through RF1-4, respectively, and convert the first through fourth baseband sub-streams of the second baseband data stream BB-2 into the first through fourth RF sub-streams RF2-1 through RF2-4. Each RF sub-stream may comprise a respective RF signal.

In some embodiments, a single radio 142 may provide both the first baseband data stream BB-1 and the second baseband data stream BB-2. For example, an 8T8R radio may provide two 4T4R data streams. In other embodiments, the first baseband data stream BB-1 can be generated by a first 4T4R radio and the second baseband data stream BB-2 can be generated by a second 4T4R radio. Moreover, when two 4T4R radios are used, each 4T4R radio may provide half of the RF sub-streams of each baseband data stream. As an example, a first 4T4R radio may provide the four RF sub-streams RF1-1, RF2-1, RF1-2, and RF2-2, and a second 4T4R radio may provide the four RF sub-streams RF1-3, RF2-3, RF1-4, and RF2-4.

Embodiments of the present invention take advantage of the fact that the radio can be programmed to transmit each RF sub-stream through two of the columns 170 instead of through just a single column 170. For example, RF sub-stream RF 1-1 may be transmitted through both the first column 170-1 and through the second column 170-2. Since RF sub-stream RF 1-1 is transmitted through two horizontally spaced apart columns, the combined antenna beam corresponding to the portion of RF sub-stream RF 1-1 that is transmitted through the first column 170-1 and the portion of RF sub-stream RF 1-1 that is transmitted through the second column 170-2 will have a narrowed azimuth HPBW. Thus, the above-discussed problem of wide azimuth HPBWs that would result if two 4T4R radios are used with an 8T8R beamforming array such as array 171 is solved because the azimuth beamwidth of the antenna beams corresponding to each RF sub-stream are narrowed since the RF sub-stream is transmitted through two columns 170.

Moreover, the four sub-streams RF1-1 through RF1-4 may operate in a frequency band different from that of the four sub-streams RF2-1 through RF2-4. For example, the sub-streams RF1-1 through RF1-4 may operate in a first frequency band that includes all or a portion of 2,350-2,370 MHz, and the sub-streams RF2-1 through RF2-4 may operate in a second frequency band that includes all or a portion of 2,370-2,390 MHz. According to some embodiments, each radio 142 can provide both the first and second frequency bands. The use of these two different frequency bands can reduce interference.

Since beamforming array 171 is fed through a total of eight RF ports, and each RF sub-stream from the radio is coupled to two RF ports (to feed two columns 170), it is necessary that the radio output portions of two different RF sub-streams at each radio port. However, since the RF sub-streams RF1-1 through RF1-4 are in a different frequency band than the RF sub-streams RF2-1 through RF2-4, one of the RF sub-streams RF1-1 through RF1-4 and one of the RF sub-streams RF2-1 through RF2-4 may be fed to each RF port 145 without interference since the two RF sub-streams fed to each port 145 are in different frequency bands. Thus, by outputting at each radio port 143 (FIGS. 1C, 1D) a combination of one of RF sub-streams RF1-1 through RF1-4 and one of RF sub-streams RF2-1 through RF2-4, it is possible to use the 8T8R beamforming array 171 with two 4T4R radios while generating higher gain antenna beams that fit within the sector.

Figure 3B:
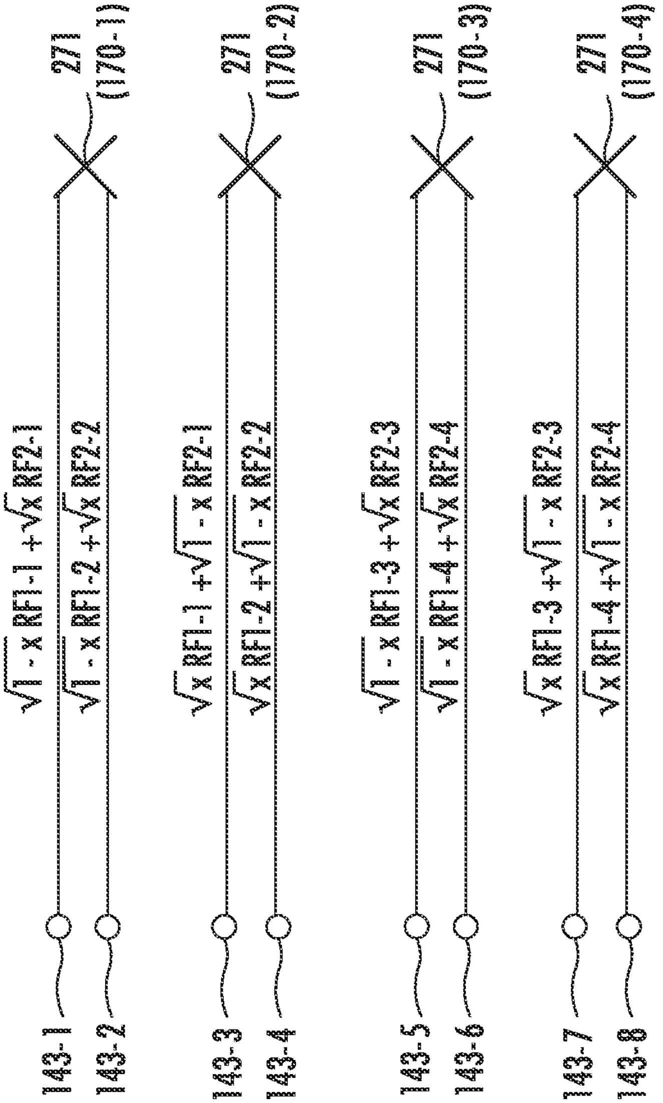
FIG. 3B is a schematic diagram of combinations of the sub-streams of FIG. 3A that are output through each of the radio ports of FIG. 1C (or FIG. 1D) to the columns of FIG. 2.

FIG. 3B is a schematic diagram illustrating the combinations of different RF sub-streams that are output through each of the radio ports 143 to the columns 170-1 through 170-4 of radiating elements 271 of FIG. 2 via the eight antenna ports 145-1 through 145-8 of FIG. 1C (or FIG. 1D). Eight RF signals can be provided to the four columns 170-1 through 170-4 of radiating elements because the radiating elements 271 are dual-polarized (e.g., slant −/+45° cross-dipole radiating elements) so that each column 170 actually includes two columns of dipole radiators and hence each column can be connected to a pair of radio ports (with the first port coupled to the dipole radiators that have the first polarization and the second radio port coupled to the dipole radiators having the second polarization). As an example, the ports 145-1, 145-3, 145-5, and 145-7 may be first-polarization ports that are coupled to first-polarization radiators of the columns 170, and the ports 145-2, 145-4, 145-6, and 145-8 may be second-polarization ports that are coupled to second-polarization radiators of the columns 170, where the second polarization (e.g., −45°) is different from (e.g., orthogonal to) the first polarization (+45°).

As shown in FIG. 3B, each radio port 143 outputs an RF signal that is a combination of both a sub-stream generated from the first baseband data stream BB-1 and a sub-stream generated from the second baseband data stream BB-2. The radio 142 may generate the eight combined RF signals shown in FIG. 3B and may provide the eight combined RF signals to the eight antenna ports 145-1 through 145-8, respectively.

For simplicity of illustration, only a single radiating element 271 per column 170 is shown in FIG. 3B. Each column 170, however, may (and typically will) include a plurality of radiating elements 271 that are each coupled to two ports 145 (one per polarization).

Each combined RF signal shown in FIG. 3B will be amplified by a respective power amplifier of the radio 142 (the radio 142 includes eight power amplifiers that amplify the respective RF signals that are output through the eight radio ports 143). The relative power of the two RF sub-streams output through each radio port 143 will determine how much each RF sub-stream is amplified. For example, as shown in FIG. 3B, RF sub-streams RF1-1 and RF2-1 are output through the first radio port 143-1. The magnitude of these RF sub-streams that are fed to the power amplifier associated with radio port 143-1 may be $\sqrt{1-x}$ RF1-1 and $\sqrt{x}$ RF2-1, where "1−x" and "x" represent the powers of the two RF sub-streams. The power amplifier will apply 100% of its amplification power to the two RF sub-streams so that no power is lost. For example, if x is set to be 0.4, then 60% of the amplification power of the power amplifier will be applied to sub-stream RF1-1 and the remaining 40% will be applied to RF sub-stream RF2-1. As described above, RF sub-streams RF 1-1 and RF2-1 are also output from radio port 143-3 with the reverse power allocation corresponding to magnitudes $\sqrt{x}$ RF1-1 and $\sqrt{1-x}$ RF2-1. The value of "x" may be selected to achieve a desired azimuth beamwidth for the combined antenna beams generated by the signals output through radio ports 143-1 and 143-3 to RF ports 145-1 and 145-3. A value of x=0.5 results in equal power components of RF1-1 and RF2-1 being output through the first and second columns 170-1, 170-2, which will result in the greatest narrowing of the azimuth HPBW. As x moves away (in either direction) from the value of 0.5, the azimuth HPBW of the resulting antenna beams increases. In some embodiments, x may have a positive non-zero value that is less than 1.

According to some embodiments, the radio 142 may generate antenna beams by multiplying each RF sub-stream RF1-1 through RF1-4, RF2-1 through RF2-4 by a respective complex scalar representing magnitude and phase. The eight combinations of RF sub-streams shown in FIG. 3B may thus each have two complex scalars. For example, the radio 142 may digitally apply the magnitudes and phases in baseband (i.e., before converting to RF signals). For simplicity of illustration, however, the phases are omitted from view in FIG. 3B.

Figure 4A:
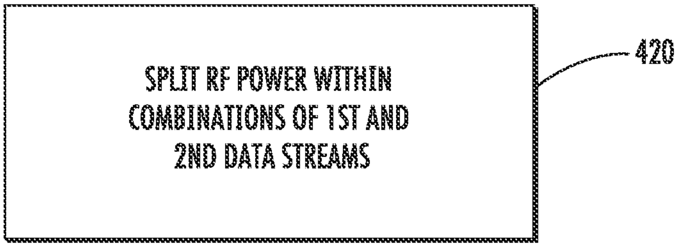
FIGS. 4A-4G are flowcharts illustrating operations of splitting RF power within each of the RF sub-stream combinations shown in FIG. 3B.

FIGS. 4A-4G are flowcharts illustrating operations of splitting RF power within each of the combinations of RF sub-streams shown in FIG. 3B. As shown in FIG. 4A, the operations may include splitting (Block 420) RF power within each of a plurality of combinations of first and second RF sub-streams. For example, a radio 142 (FIG. 1B) may combine RF sub-streams of the first and second baseband data streams BB-1, BB-2 in the digital domain, where RF power is split for (i.e., distributed within) each RF sub-stream combination.

Figure 4B:
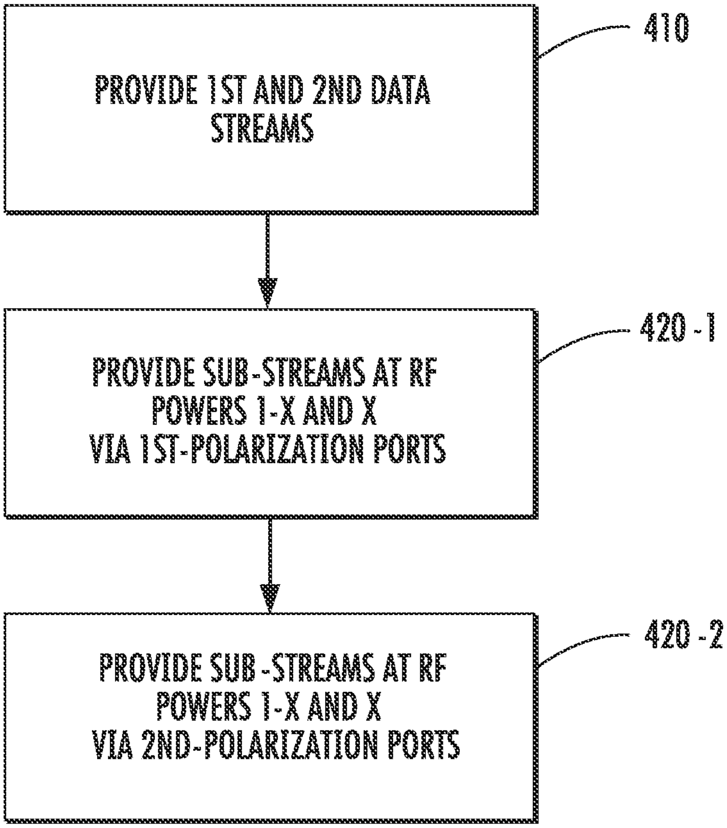

As shown in FIG. 4B, the first and second baseband data streams BB-1, BB-2, respectively, may be provided (Block 410). For example, the radio 142 or baseband equipment may generate the first and second baseband data streams BB-1, BB-2. The radio 142 may subsequently convert the first and second baseband data streams BB-1, BB-2 into four RF sub-streams RF1-1 through RF1-4 (FIG. 3A) and four RF sub-streams RF2-1 through RF2-4 (FIG. 3A).

Moreover, operations of splitting (Block 420 of FIG. 4A) RF power may include providing (Block 420-1) the four sub-streams RF1-1, RF2-1, RF1-3, and RF2-3 at the two RF powers 1−x and x (FIG. 3B) via first-polarization radio ports 143-1, 143-3, 143-5, 143-7 (FIG. 3B) to first-polarization antenna ports 145-1, 145-3, 145-5, 145-7 (FIG. 1C), respectively. In some embodiments, the radio ports 143-1, 143-3, 143-5, 143-7 are all part of a single radio 142. In other embodiments, the radio ports 143-1, 143-3 may be part of a first radio 142-1 (FIG. 1D), and the radio ports 143-5, 143-7 may be part of a second radio 142-2 (FIG. 1D).

Operations of splitting (Block 420 of FIG. 4A) RF power between the columns 170 may also include providing (Block 420-2) the four sub-streams RF1-2, RF2-2, RF1-4, and RF2-4 at the two RF powers 1−x and x (FIG. 3B) via second-polarization radio ports 143-2, 143-4, 143-6, 143-8 (FIG. 3B) to second-polarization antenna ports 145-2, 145-4, 145-6, 145-8 (FIG. 1C), respectively. In some embodiments, the radio ports 143-2, 143-4, 143-6, 143-8 are all part of a single radio 142. In other embodiments, the radio ports 143-2, 143-4 may be part of a first radio 142-1, and the radio ports 143-6, 143-8 may be part of a second radio 142-2.

Figure 4C:
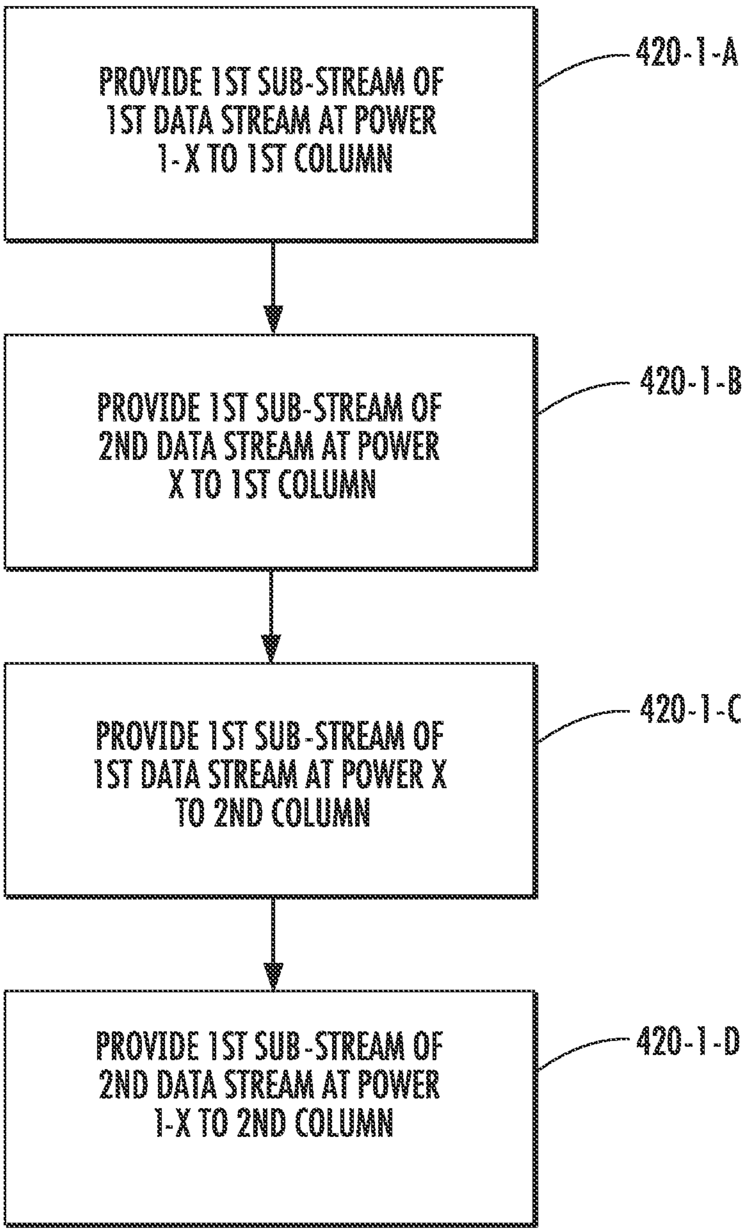

As shown in FIGS. 4C and 3B, operations of providing (Block 420-1 of FIG. 4B) sub-streams via first-polarization radio ports 143-1, 143-3, 143-5, 143-7 may include providing (Block 420-1-A) the first RF sub-stream RF1-1 of the first baseband data stream BB-1 at the first RF power 1−x to the first column 170-1 via the first radio port 143-1. The operations may also include providing (Block 420-1-B) the first RF sub-stream RF2-1 of the baseband second data stream BB-2 at the second RF power x to the first column 170-1 via the first radio port 143-1.

Operations of providing (Block 420-1 of FIG. 4B) sub-streams via first-polarization radio ports 143-1, 143-3, 143-5, 143-7 may also include providing (Block 420-1-C) the first RF sub-stream RF1-1 of the first baseband data stream BB-1 at the second RF power x to the second column 170-2 via the third radio port 143-3. The first and second columns 170-1, 170-2 are consecutive columns 170, and thus do not have another column 170 therebetween. Moreover, the operations may include providing (Block 420-1-D) the first RF sub-stream RF2-1 of the second baseband data stream BB-2 at the first RF power 1−x to the second column 170-2 via the third radio port 143-3.

According to some embodiments, the radio 142 may generate the RF sub-streams RF1-1 through RF1-4 and RF2-1 through RF2-4 separately/individually and add them in sub-stream pairs by superposition (e.g., while maintaining the total amplitude below a maximum possible level). For example, the radio 142 may comprise a weighted combiner in the digital domain. The weighted combiner can combine two sub-streams having respective amplitude weights (and thus respective powers). As an example, where the first power 1−x is 0.9 (i.e., 90%) and the second power x is 0.1 (i.e., 10%), the radio 142 may apply a first digital amplitude weight of 0.95 for each sub-stream having the first power 1−x and a second digital amplitude weight of 0.32 for each sub-stream having the second power x. The first and second digital amplitude weights may thus be different from each other.

For simplicity of illustration, the four Blocks 420-1-A through 420-1-D are shown sequentially in FIG. 4C. In some embodiments, however, operation(s) of two or more of the four Blocks 420-1-A through 420-1-D may be performed concurrently. As an example, operation(s) of Block 420-1-B may be performed concurrently with operation(s) of Block 420-1-A and/or concurrently with operation(s) of Block 420-1-C and/or Block 420-1-D.

Figure 4D:
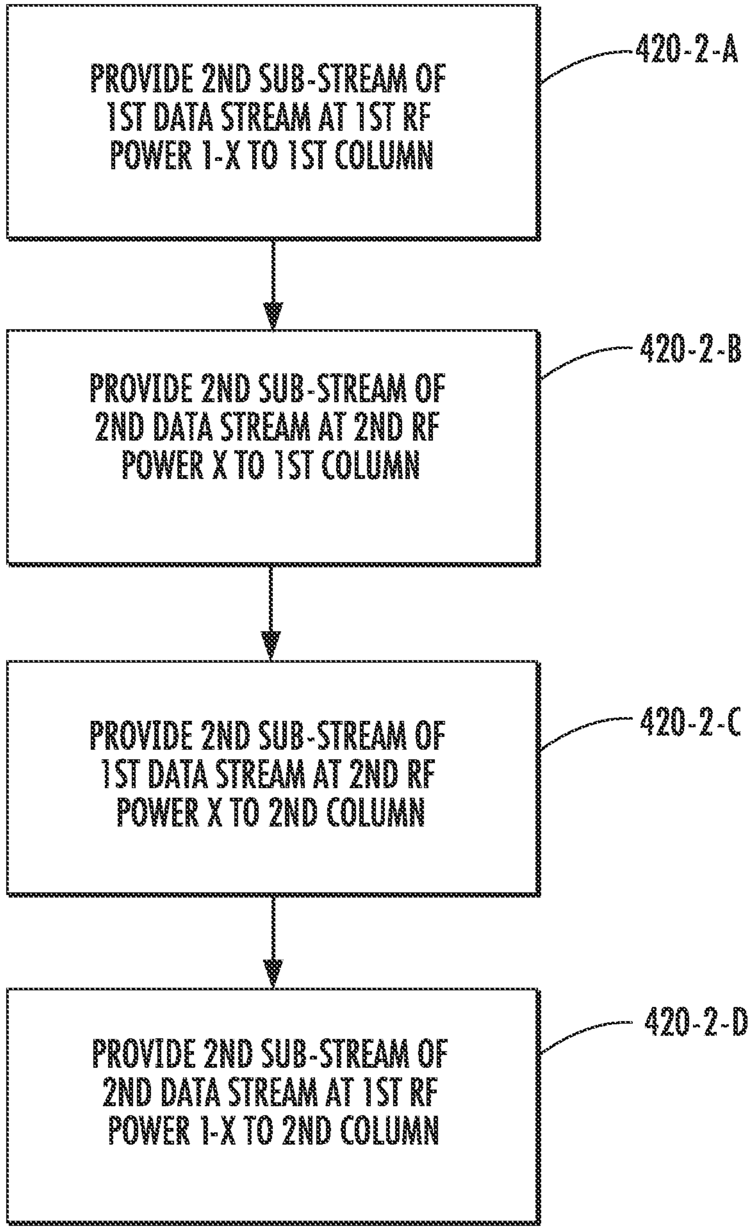

As shown in FIGS. 4D and 3B, operations of providing (Block 420-2 of FIG. 4B) sub-streams via second-polarization radio ports 143-2, 143-4, 143-6, 143-8 may include providing (Block 420-2-A) the second RF sub-stream RF1-2 of the first baseband data stream BB-1 at the first RF power 1−x to the first column 170-1 via the second radio port 143-2. The operations may also include providing (Block 420-2-B) the second RF sub-stream RF2-2 of the second baseband data stream BB-2 at the second RF power x to the first column 170-1 via the second radio port 143-2.

Operations of providing (Block 420-2 of FIG. 4B) sub-streams via the radio ports 143-2, 143-4, 143-6, 143-8 may also include providing (Block 420-2-C) the second RF sub-stream RF1-2 of the first baseband data stream BB-1 at the second RF power x to the second column 170-2 via the fourth radio port 143-4. Moreover, the operations may include providing (Block 420-2-D) the second RF sub-stream RF2-2 of the second baseband data stream BB-2 at the first RF power 1−x to the second column 170-2 via the fourth radio port 143-4.

For simplicity of illustration, the four Blocks 420-2-A through 420-2-D are shown sequentially in FIG. 4D. In some embodiments, however, operation(s) of two or more of the four Blocks 420-2-A through 420-2-D may be performed concurrently. As an example, operation(s) of Block 420-2-B may be performed concurrently with operation(s) of Block 420-2-A and/or concurrently with operation(s) of Block 420-2-C and/or Block 420-2-D. Moreover, one or more of the four Blocks 420-2-A through 420-2-D may be performed concurrently with one or more of the four Blocks 420-1-A through 420-1-D of FIG. 4C.

Figure 4E:
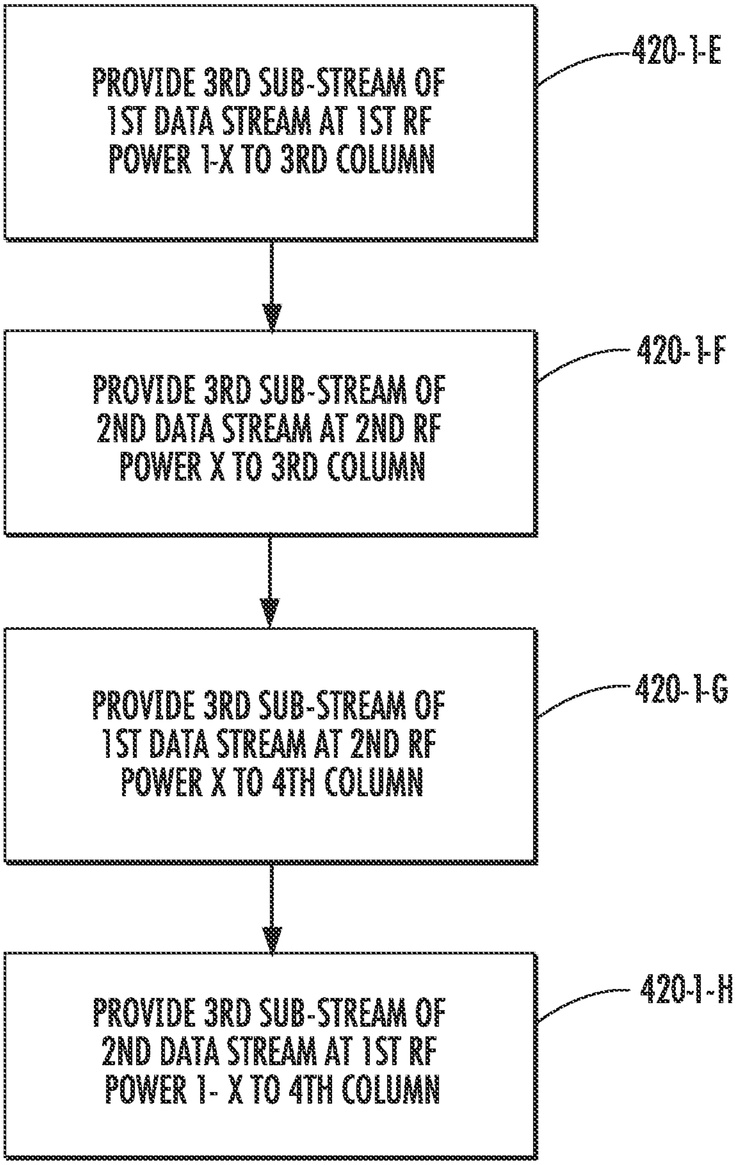

As shown in FIGS. 4E and 3B, operations of providing (Block 420-1 of FIG. 4B) sub-streams via first-polarization radio ports 143-1, 143-3, 143-5, 143-7 may further include providing (Block 420-1-E) the third RF sub-stream RF1-3 of the first baseband data stream BB-1 at the first RF power 1−x to the third column 170-3 via the fifth radio port 143-5. The operations may also include providing (Block 420-1-F) the third RF sub-stream RF2-3 of the second baseband data stream BB-2 at the second RF power x to the third column 170-3 via the fifth radio port 143-5.

Operations of providing (Block 420-1 of FIG. 4B) sub-streams via the radio ports 143-1, 143-3, 143-5, 143-7 may also include providing (Block 420-1-G) the third RF sub-stream RF1-3 of the first baseband data stream BB-1 at the second RF power x to the fourth column 170-4 via the seventh radio port 143-7. The third and fourth columns 170-3, 170-4 are consecutive columns 170, where the third column 170-3 is between the second and fourth columns 170-2, 170-4. Moreover, the operations may include providing (Block 420-1-H) the third RF sub-stream RF2-3 of the second baseband data stream BB-2 at the first RF power 1−x to the fourth column 170-4 via the seventh radio port 143-7.

For simplicity of illustration, the four Blocks 420-1-E through 420-1-H are shown sequentially in FIG. 4E. In some embodiments, however, operation(s) of two or more of the four Blocks 420-1-E through 420-1-H may be performed concurrently. As an example, operation(s) of Block 420-1-F may be performed concurrently with operation(s) of Block 420-1-E and/or concurrently with operation(s) of Block 420-1-G and/or Block 420-1-H. Moreover, one or more of the four Blocks 420-1-E through 420-1-H may be performed concurrently with one or more of the four Blocks 420-1-A through 420-1-D of FIG. 4C.

Figure 4F:
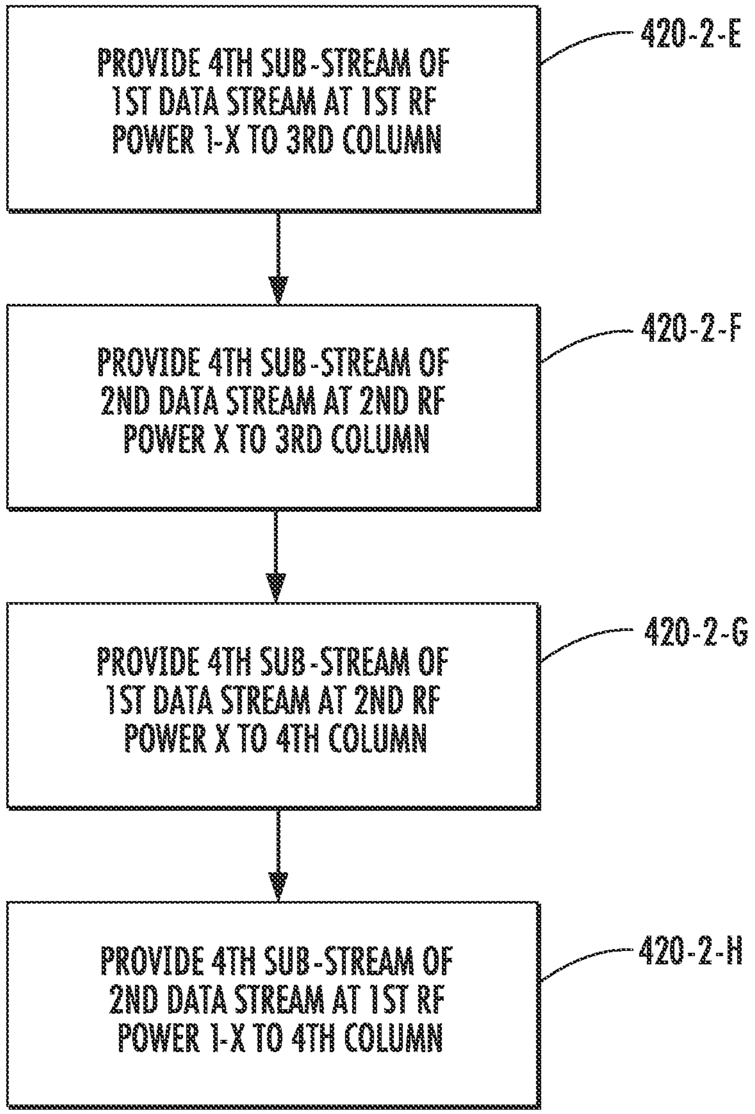

As shown in FIGS. 4F and 3B, operations of providing (Block 420-2 of FIG. 4B) sub-streams via second-polarization radio ports 143-2, 143-4, 143-6, 143-8 may further include providing (Block 420-2-E) the fourth RF sub-stream RF1-4 of the first baseband data stream BB-1 at the first RF power 1−x to the third column 170-3 via the sixth radio port 143-6. Moreover, the operations may include providing (Block 420-2-F) the fourth RF sub-stream RF2-4 of the second baseband data stream BB-2 at the second RF power x to the third column 170-3 via the sixth radio port 143-6.

Operations of providing (Block 420-2 of FIG. 4B) sub-streams via radio ports 143-2, 143-4, 143-6, 143-8 may also include providing (Block 420-2-G) the fourth RF sub-stream RF1-4 of the first baseband data stream BB-1 at the second RF power x to the fourth column 170-4 via the eighth radio port 143-8. Moreover, the operations may include providing (Block 420-2-H) the fourth RF sub-stream RF2-4 of the second baseband data stream BB-2 at the first RF power 1−x to the fourth column 170-4 via the eighth radio port 143-8.

For simplicity of illustration, the four Blocks 420-2-E through 420-2-H are shown sequentially in FIG. 4F. In some embodiments, however, operation(s) of two or more of the four Blocks 420-2-E through 420-2-H may be performed concurrently. As an example, operation(s) of Block 420-2-F may be performed concurrently with operation(s) of Block 420-2-E and/or concurrently with operation(s) of Block 420-2-G and/or Block 420-2-H. Moreover, one or more of the four Blocks 420-2-E through 420-2-H may be performed concurrently with one or more of the four Blocks 420-2-A through 420-2-D of FIG. 4D.

Figure 4G:
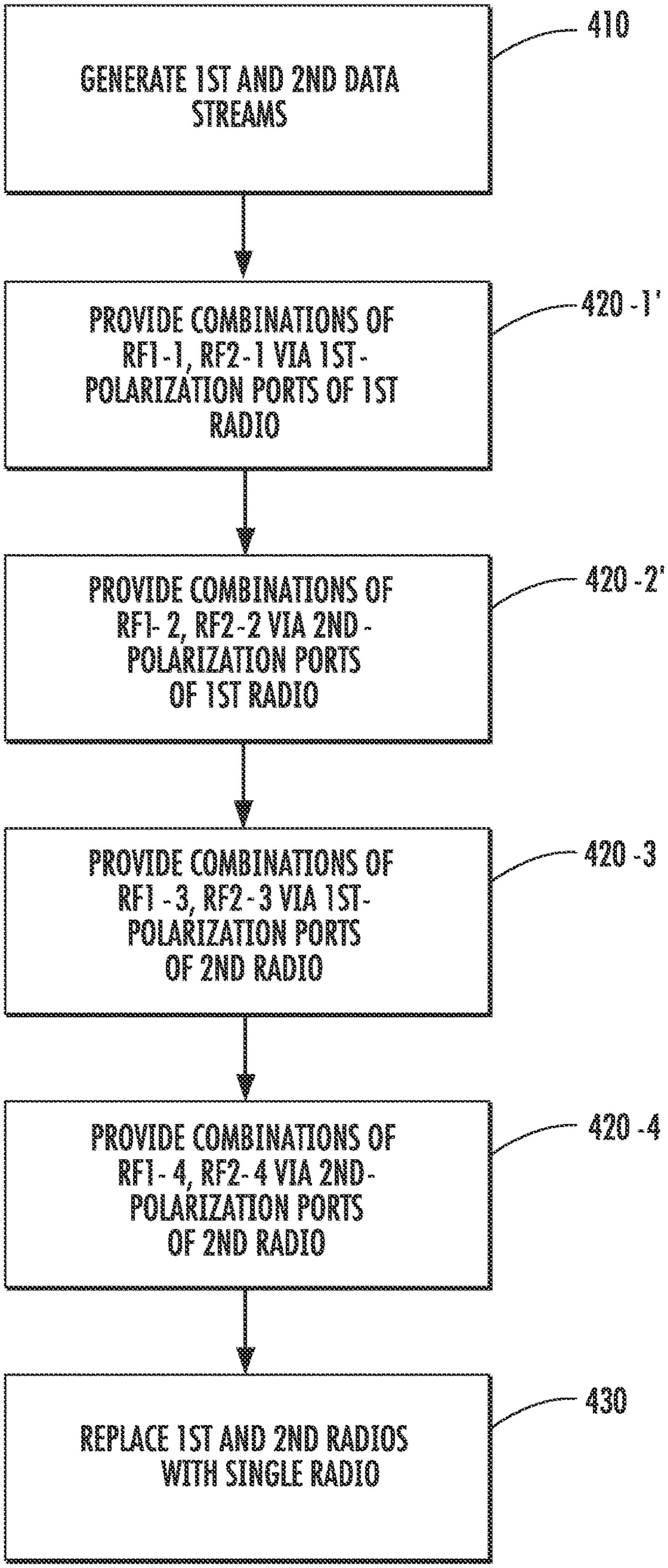

FIG. 4G shows an example in which the eight radio ports 143-1 through 143-8 are distributed among multiple radios 142. As illustrated in FIG. 4G, combinations shown in FIG. 3B of the sub-streams RF1-1, RF2-1 may be provided (Block 420-1') by first-polarization radio ports 143-1, 143-3 of a first radio 142-1 (FIG. 1D). Moreover, the first radio 142-1 may provide (Block 420-2') combinations shown in FIG. 3B of the sub-streams RF1-2, RF2-2 via second-polarization radio ports 143-2, 143-4, respectively.

A second radio 142-2 (FIG. 1D) may provide (Block 420-3) combinations shown in FIG. 3B of the sub-streams RF1-3, RF2-3 via first-polarization radio ports 143-5, 143-7. Moreover, the second radio 142-2 may provide (Block 420-4) combinations shown in FIG. 3B of the sub-streams RF1-4, RF2-4 via second-polarization radio ports 143-6, 143-8.

In some embodiments, after providing the eight RF sub-stream combinations shown in FIG. 3B via the first and second radios 142-1, 142-2 as shown in Blocks 420-1' through 420-4, the first and second radios 142-1, 142-2 may be replaced (Block 430) with a single radio 142. For example, the single radio 142 may have eight ports 143-1 through 143-8 that are coupled to the eight antenna ports 145-1 through 145-8, respectively.

Figure 5:
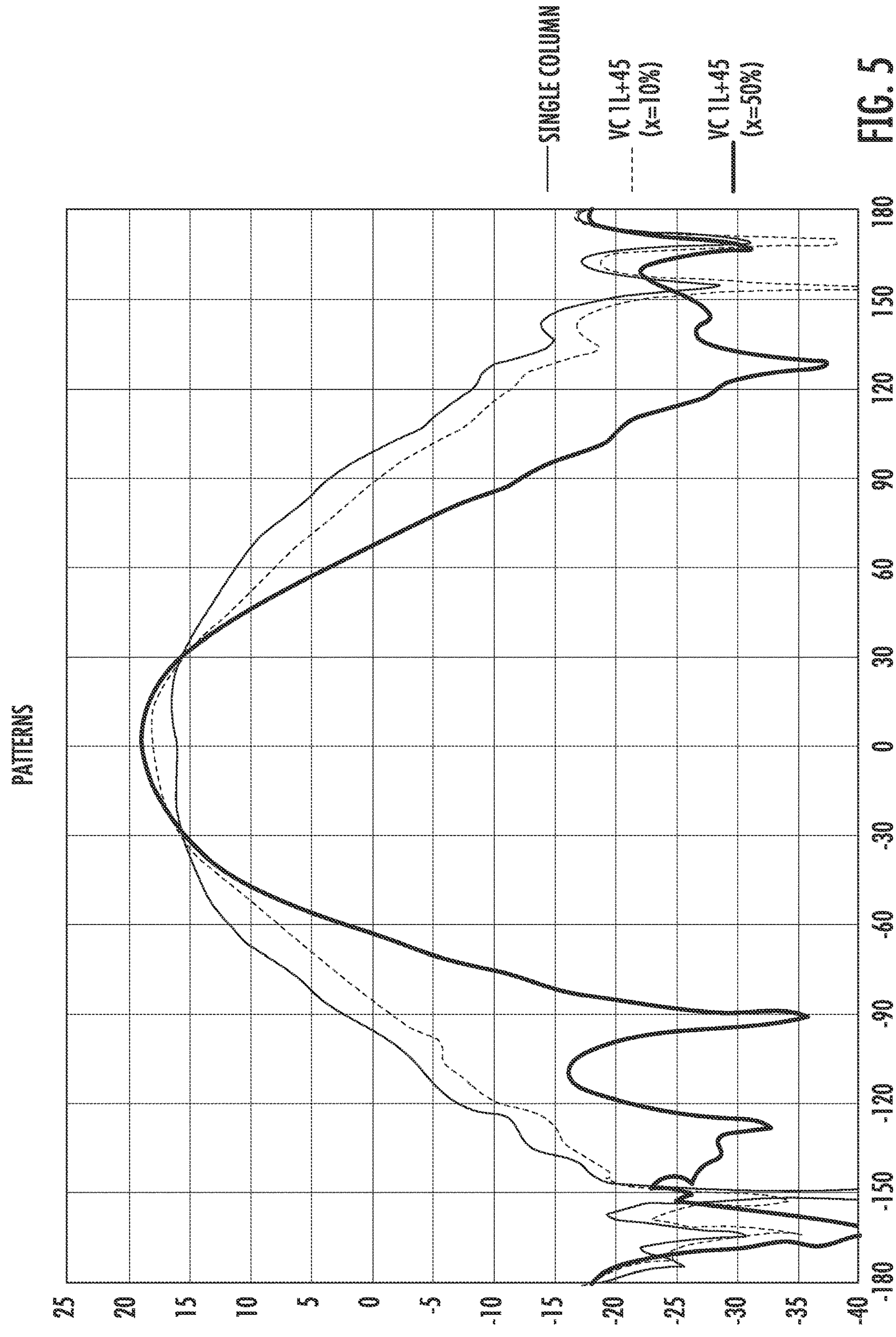
FIG. 5 is a graph illustrating radiation patterns of columns of FIG. 2 according to different examples.

FIG. 5 is a graph illustrating radiation patterns of columns 170 of FIG. 2 according to different examples. In the first example, a radiation pattern for a single physical column 170 may have the lowest gain (e.g., about 16.6 dB) and the widest azimuth HPBW (e.g., about 94°). In contrast, by distributing power for each RF sub-stream between first and second powers 1−x and x (FIG. 3B) across different physical columns 170, "virtual columns" can be provided that achieve higher gain and narrower azimuth HPBW. For example, the adjacent first and second physical columns 170-1, 170-2 may together be implemented as a virtual column that provides the RF sub-stream RF1-1, where the RF sub-stream RF1-1 having the first power 1−x applied thereto is provided to the first physical column 170-1 and where the RF sub-stream RF1-1 having the second power x applied thereto is provided to the second physical column 170-2. In embodiments where the value of x is 0.10, the gain for a virtual column may be higher (e.g., about 18.2 dB) than that for a single physical column 170 and the azimuth HPBW may be narrower (e.g., about 65°). Moreover, in embodiments where the value of x is 0.50, the gain for a virtual column may be even higher (e.g., about 19.1 dB) and the azimuth HPBW may be even narrower (e.g., about 57°).

Radios 142 (FIG. 1B) according to embodiments of the present invention may provide a number of advantages. These advantages include generating, using two 4T4R radio systems in conjunction with a multi-column (e.g., 8T8R) beamforming array 171 (FIGS. 1C and 1D) of radiating elements 271 (FIG. 2), antenna beams having narrowed azimuth HPBW and/or increased gain. Moreover, 100% of the power generated by the radios 142 may be used (thus achieving zero power loss) by distributing the total power among two RF sub-streams that are output at a radio port 143 (FIG. 3B).

For example, by splitting power between two RF sub-streams that are provided to the same radio port 143 (FIG. 3B), a 4T4R radio 142 may narrow HPBW to about 65° (e.g., when the first and second powers 1−x and x (FIG. 3B) are 0.9 and 0.1, respectively) or about 57° (e.g., when the first and second powers 1−x and x are each 0.5). The 4T4R radio 142 can thus be used together with the 8T8R beamforming array 171 to provide radiation patterns resembling those of conventional 4T4R antenna arrays.

According to some embodiments, the first and second powers 1−x and x of the respective sub-streams output at a radio port 143 may collectively equal 100% of a total (e.g., maximum) amplification power of a power amplifier coupled to the radio port 143, thus reducing/eliminating power loss by the radio 142. The total amplification power for each radio port 143 of the radio 142 can be distributed in this manner. Moreover, the radio 142 may increase gain by about 1.6 dB (e.g., from about 16.6 dB to about 18.2 dB when the first and second powers 1−x and x are 0.9 and 0.1, respectively), or by about 2.5 dB (e.g., from about 16.6 dB to about 19.1 dB when the first and second powers 1−x and x are each 0.5).

In some embodiments, an 8T8R beamforming array 171 can initially be used with two 4T4R radios 142-1, 142-2 (FIG. 1D), and later can be used with a single 8T8R radio 142 (FIG. 1C). Such radios 142 can thus provide operators with greater flexibility and allow them to use the same base station antenna with different radio 142 combinations.

The present invention has been described above with reference to the accompanying drawings. The present invention is not limited to the illustrated embodiments. Rather, these embodiments are intended to fully and completely disclose the present invention to those skilled in this art. In the drawings, like numbers refer to like elements throughout. Thicknesses and dimensions of some components may be exaggerated for clarity.

Spatially relative terms, such as "under," "below," "lower," "over," "upper," "top," "bottom," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the example term "under" can encompass both an orientation of over and under. The device may be otherwise oriented (rotated 90 degrees or at other orientations) and the spatially relative descriptors used herein interpreted accordingly.

Herein, the terms "attached," "connected," "interconnected," "contacting," "mounted," "coupled," and the like can mean either direct or indirect attachment or coupling between elements, unless stated otherwise.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and/or "including" when used in this specification, specify the presence of stated features, operations, elements, and/or components, but do not preclude the presence or addition of one or more other features, operations, elements, components, and/or groups thereof.

Example embodiments of the present inventive concepts may be embodied as devices (e.g., radios) and methods. Accordingly, example embodiments of present inventive concepts may be embodied in hardware and/or in software (including firmware, resident software, micro-code, etc.). Furthermore, example embodiments of present inventive concepts may take the form of a computer program product comprising a non-transitory computer-usable or computer-readable storage medium having computer-usable or computer-readable program code embodied in the medium for use by or in connection with an instruction execution system. In the context of this document, a computer-usable or computer-readable medium may be any medium that can contain, store, communicate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, or device. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Example embodiments of present inventive concepts are described herein with reference to flowchart and/or block diagram illustrations. It will be understood that each block of the flowchart and/or block diagram illustrations, and combinations of blocks in the flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create/use circuits for implementing the functions specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the functions specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

What is claimed is:

1. A radio, comprising:

a plurality of first-polarization radio frequency (RF) ports that are configured to be coupled to respective first-polarization RF ports of an antenna that are coupled to a plurality of columns, respectively, of dual-polarized radiating elements of the antenna; and a plurality of second-polarization RF ports that are configured to be coupled to respective second-polarization RF ports of the antenna that are coupled to the columns, respectively, wherein the first polarization is different from the second polarization, wherein a first of the first-polarization RF ports of the radio is configured to provide to a first of the columns of dual-polarized radiating elements:

a first RF sub-stream of a first baseband data stream at a first RF power represented by (1-x); and a first RF sub-stream of a second baseband data stream at a second RF power represented by x, where x is a percentage of total amplification power of a power amplifier coupled to the first of the first-polarization RF ports of the radio, the second RF power being different from the first RF power, and wherein a second of the first-polarization RF ports of the radio is configured to provide to a second of the columns of dual-polarized radiating elements:

the first RF sub-stream of the first baseband data stream at the second RF power represented by x; and the first RF sub-stream of the second baseband data stream at the first RF power represented by (1-x).

2. The radio of claim 1, wherein the radio is configured to generate the first RF sub-stream of the first baseband data stream and the first RF sub-stream of the second baseband data stream in first and second frequency bands, respectively, that are different from each other.

3. The radio of claim 1, wherein the first and second RF powers collectively equal 100% of a total amplification power of a power amplifier coupled to the first of the first-polarization RF ports of the radio.

4. The radio of claim 1, wherein a first of the second-polarization RF ports of the radio is configured to provide to the first of the columns:

a second RF sub-stream of the first baseband data stream at the first RF power; and a second RF sub-stream of the second baseband data stream at the second RF power.

5. The radio of claim 4, wherein a second of the second-polarization RF ports of the radio is configured to provide to the second of the columns:

the second RF sub-stream of the first baseband data stream at the second RF power; and the second RF sub-stream of the second baseband data stream at the first RF power.

6. The radio of claim 5, wherein the radio is configured to multiply each RF sub-stream of each of the first and second baseband data streams by a respective complex scalar representing magnitude and phase.

7. The radio of claim 5, wherein the first and second of the columns are consecutive columns, wherein the first and second of the first-polarization RF ports of the antenna are coupled to the first and second of the columns, respectively, and wherein the first and second of the second-polarization RF ports of the antenna are coupled to the first and second of the columns, respectively.

8. The radio of claim 7, wherein the radio is a first of a plurality of radios that are configured to be coupled to the antenna, and wherein a second of the radios is configured to provide to a third and a fourth of the columns:

a third RF sub-stream of the first baseband data stream together with a third RF sub-stream of the second baseband data stream; and a fourth RF sub-stream of the first baseband data stream together with a fourth RF sub-stream of the second baseband data stream.

9. The radio of claim 1, wherein an azimuth half power beamwidth of a combined antenna beam corresponding to a portion of the first of the RF sub-streams that is transmitted through the first column and a portion of the first of the RF sub-streams that is transmitted through the second column is narrowed to less than or equal to 65 degrees.

10. A method of operating a radio that is coupled to an antenna comprising a plurality of columns of dual-polarized radiating elements, the method comprising:

providing to a first of the plurality of columns of dual-polarized radiating elements via a first of a plurality of first-polarization ports of the radio:

a first RF sub-stream of a first baseband data stream at a first radio frequency (RF) power of (1-x); and a first RF sub-stream of a second baseband data stream at a second RF power of x, where (1-x) and x represent a percentage of total amplification power of a power amplifier coupled to the first of the first-polarization ports of the radio;

providing to a second of the plurality of columns of dual-polarized radiating elements via a second of the plurality of first-polarization ports of the radio:

the first RF sub-stream of the first baseband data stream at the second RF power; and the first RF sub-stream of the second baseband data stream at the first RF power; and selecting a value of x to achieve a desired azimuth beamwidth for combined antenna beams generated by signals output through the first and second of the plurality of first-polarization ports of the radio.

11. The method of claim 10, further comprising generating the first RF sub-stream of the first baseband data stream and the first RF sub-stream of the second baseband data stream in first and second frequency bands, respectively, that are different from each other.

12. The method of claim 10, wherein the radio multiplies each RF sub-stream of each of the first and second baseband data streams by a respective complex scalar representing magnitude and phase.

13. The method of claim 10, further comprising:

providing to the first of the plurality of columns via a first of a plurality of second-polarization ports of the radio:

a second RF sub-stream of the first baseband data stream at the first RF power; and a second RF sub-stream of the second baseband data stream at the second RF power, wherein the second polarization is different from the first polarization.

14. The method of claim 13, further comprising:

providing to the second of the columns via a second of the second-polarization ports:

the second RF sub-stream of the first baseband data stream at the second RF power; and the second RF sub-stream of the second baseband data stream at the first RF power.

15. The method of claim 14, wherein the first and second of the columns comprise consecutive columns.

16. The method of claim 15, wherein the radio is a first radio, and wherein the method further comprises splitting, by a second radio, RF power by providing:

a third RF sub-stream of the first baseband data stream together with a third RF sub-stream of the second baseband data stream; and a fourth RF sub-stream of the first baseband data stream together with a fourth RF sub-stream of the second baseband data stream.

17. The method of claim 16, further comprising integrating the first and second radios into a single radio that is coupled to the first through fourth of the columns.

* * * * *